United States Patent [19]

Okuaki

[11] Patent Number: 4,723,156
[45] Date of Patent: Feb. 2, 1988

[54] EPROM DEVICE AND A MANUFACTURING METHOD THEREOF

[75] Inventor: Hiroshi Okuaki, Tokyo, Japan

[73] Assignee: Oki Electric Industry Co., Ltd., Tokyo, Japan

[21] Appl. No.: 70,123

[22] Filed: Jul. 6, 1987

Related U.S. Application Data

[63] Continuation of Ser. No. 766,296, Aug. 16, 1985.

[30] Foreign Application Priority Data

Aug. 20, 1984 [JP] Japan ............................... 59-171451

[51] Int. Cl.⁴ ...................... H01L 23/10; H01L 23/30
[52] U.S. Cl. .......................................... 357/72; 357/74
[58] Field of Search ................ 357/72, 74, 84, 73, 357/68; 174/52 FP

[56] References Cited

U.S. PATENT DOCUMENTS 4,494,217 1/1985 Suzuki et al. ..................... 357/84
4,635,165 1/1987 Okuaki .

FOREIGN PATENT DOCUMENTS

| 57-59364 | 9/1980 | Japan . | |
| 0137660 | 11/1981 | Japan | 357/72 |
| 0095844 | 6/1983 | Japan | 357/72 |
| 58-106851 | 6/1983 | Japan . | |
| 0140250 | 10/1983 | Japan | 357/84 |
| 0207656 | 12/1983 | Japan | 357/72 |

*Primary Examiner*—Martin H. Edlow
*Assistant Examiner*—S. V. Clark
*Attorney, Agent, or Firm*—Wenderoth, Lind & Ponack

[57] ABSTRACT

An EPROM device includes a hollow cap having a head portion made of a material which passes UV rays therethrough and is installed on a lead frame covering an EPROM chip. An UV ray permeable resin fills at least a gap between the head portion of the hollow cap and a main surface of the EPROM chip. A first insulating resin fills the remaining portion of the interior space of the hollow cap, thereby forming with the UV ray permeable resin a double filling structure filling the interior of the cap.

3 Claims, 10 Drawing Figures

EPROM DEVICE AND A MANUFACTURING METHOD THEREOF

This application is a continuation of now abandoned application Ser. No. 766,296, filed Aug. 16, 1985.

BACKGROUND OF THE INVENTION

The present invention relates to an erasable programmable read-only memory (hereinafter simply called EPROM) device of the type which can be erased by an ultra-violet (UV) ray.

An example of such an EPROM device including a ceramic dual-in-line package (hereinafter simply called ceramic package) has been well known as illustrated in FIG. 1. FIG. 1 is a perspective view of a prior art EPROM device. FIG. 2 is a cross-sectional view along section line A—A of FIG. 1. FIG. 3 is a partially enlarged view of FIG. 2.

In FIGS. 1 to 3, the EPROM device includes a ceramic header 1 formed of a base material 2, leads 3, a low melting temperature glass 4 and a ceramic cap 5 formed of the base material 2. The base material 2 is alumina ($Al_2O_3$).

A memory element 7 and a ground die 9 including a head portion 8 covered with evaporated aluminum are bonded or mounted on a chip mounting portion 6 of the header 1. After wire-bonding with thin metal wires 10 such as aluminum between the memory element 7 and the head portions 8, the header 1 with the cap 5 thereon is carried into a sealing furnace set at the melting point temperature of the low melting temperature glass 4, for example, 400° C. to 500° C., so as to seal the ceramic package by melting the low melting temperature glass 4, thereby forming the EPROM device. A window 11 through which an UV ray passes to the memory element is formed in the center of the cap 5.

According to the above mentioned prior art device, the aluminum thin metal wire 10 which electrically connects a ground electrode pad 12 of the memory element 7 to the substrate of the memory element 7 through the chip mounting portion 6 cannot be directly connected to the chip mounting portion 6 which is sintered with gold paste, because the sealing temperature of the glass is relatively high. Accordingly, aluminum thin metal wire 10 must be relayed by the head portion 8 of the ground die 9 which is a piece of silicon, and this is a difficult operation. Though a ceramic package is one of the most low-priced packages available, it has other defects due to the high sealing temperature, other than that mentioned above. One defect is that construction requires substantial time because gold wires cannot be used for wire-bonding. Another defect is that cracks can be formed in the package because the ceramic package is quite fragile with regard to shocks. Furthermore, the ceramic package is relatively heavy, thereby restricting the package density on a printed circuit board.

Examples of plastic mold type EPROM device for overcoming such defects have been proposed in Japanese application Nos. 183085/1983 and 183086/1983.

However, then still have some defects, namely:

(1) Since an UV ray permeable resin has relatively low adhesive strength and water tightness, the moisture resistance of the package is not always satisfactory. Additionally, since the plastic package has relatively low resistance to thermal stress, the quality of the package sometimes is degraded by a heat cycle test.

(2) Since the resin used in the plastic package is rather expensive, even though it provides sufficient transmittal of the UV ray, it is desired to reduce the quantity of such resin to be used.

(3) The difference in thermal expansion coefficient between sealing resin by which all packages are enclosed or the base material (alumina) and the UV ray permeable resin sometimes generates cracks in the UV ray permeable resin.

SUMMARY OF THE INVENTION

It is an object of the present invention to provide an EPROM device having a high moisture resistance.

It is another object of the present invention to provide an EPROM having a high reliability.

It is still another object of the present invention to provide an EPROM device which can be obtained at a relatively low cost.

According to the present invention, there is provided an EPROM device comprising:

(a) a lead frame having a chip mounting portion and a plurality of terminal portions thereon;

(b) An EPROM chip mounted on said chip mounting portion and connected to the terminal portions by thin metal wires;

(c) a hollow cap, including a head portion made of a material which passes UV rays therethrough, mounted on the lead frame and covering the EPROM chip and the thin metal wires;

(d) an UV ray permeable resin filling at least a gap between the head portion of the hollow cap and a main surface of the EPROM chip;

(e) a first insulating resin filling a remaining portion of the interior of the cap so as to form with the UV ray permeable resin a double filling structure filling the interior of the cap; and (f) a second insulating resin enclosing the cap except for the head portion thereof and parts of the terminal portions of the lead frame.

The above and other features and advantages of the invention will become more apparent from the following description and the accompanying drawings.

DETAILED DESCRIPTION OF THE PREFERRED EMBODIMENTS

Figure 1:
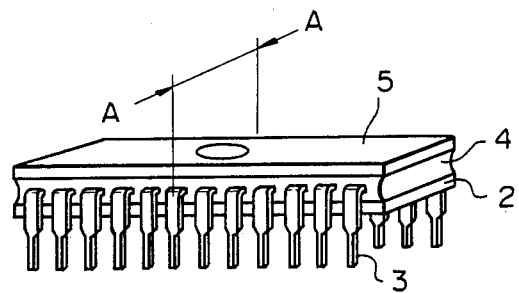
FIG. 1 is a perspective view of an EPROM device in accordance with the prior art.
Figure 2:
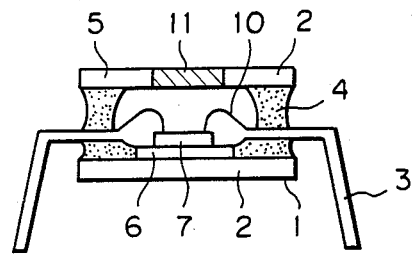
FIG. 2 is a cross-sectional view along section line A—A of FIG. 1.
Figure 3:
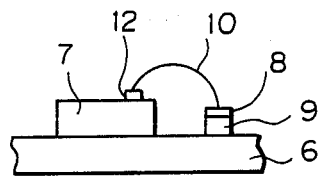
FIG. 3 is a partially enlarged view of FIG. 2.
Figure 4:
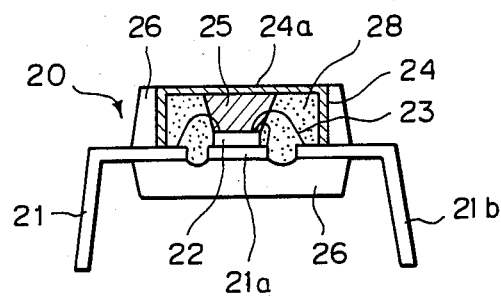
FIG. 4 is a cross-sectional view illustrating an embodiment of an EPROM device in accordance with the invention.

In FIG. 4, reference numeral 20 denotes an embodiment of the device of the invention, whereas numeral 21 denotes a lead frame.

The lead from 21 is made of metal plate and includes a chip mounting portion 21a and a plurality of terminal portions 21b constituting a wiring pattern.

An EPROM chip 22 is mounted on the chip mounting portion 21a and electrodes formed on the surface of the chip 22 are connected to the terminal portions 21b of the lead frame 21 by thin metal wires 23 such as aluminum and gold.

A hollow cap 24 is mounted on the surface of the lead frame 21 and covers chip 22, wires 23 and the areas of connection between the thin metal wires 23 and the terminal portions 21b.

The cap 24 includes a head portion 24a facing the main surface of EPROM chip 22 which is to be exposed to UV rays. Thus, head portion 24a must be made of UV ray permeable material such as quartz or alumina. However, it is better to construct the entire hollow cap 24 of the same material such as alumina, quartz or other UV ray permeable material to avoid complexity of construction.

The interior of hollow cap 24 defines a space, and an UV ray permeable resin 25 fills a portion of this space, i.e. a gap between the main surface of chip 22 or the ship mounting portion 21a and the head portion 24a of the hollow cap 24. An insulating resin 28 fills the remainder of this space around the resin 25, the chip 22, the chip mounting portion 21a and the thin metal wires 23, thereby forming with resin 25 a double filling structure filling the space and thereby protecting the EPROM chip 22 against outside moisture and impurity ions (electrode corrosive ions). Accordingly, the UV ray exposable main surface of the EPROM chip 22 is covered with the resin 25.

The resin 25 need only have the property that it transmit UV rays therethrough, because the cap 24 itself shuts down or blocks harmful stresses from the outside atmosphere, including mechanical stress, and protects the EPROM chip 22. Silicone resin such as JCR-6122 (a commercial name by Torey, Japan), for example, can be used as resin 25.

Silicone resin such as JCR-6110 (a commercial name by Torey, Japan) or epoxy resin is preferable as the insulating resin 28 filling in the cap 24 because of its highly reliable stability.

The EPROM device 20 includes an encapsulating or enclosing receptacle 26 made of synthetic resin and enclosing the device including the cap 24 except for the outer surface of the head portion 24a thereof and except for portions of terminal portions 21b.

Thermosetting epoxy resin (such as used as a semiconductor filler) is preferable as the second insulating resin (synthetic resin) which forms the receptacle 26 because of its high ability to adhere to alumina or quartz.

Figure 5:
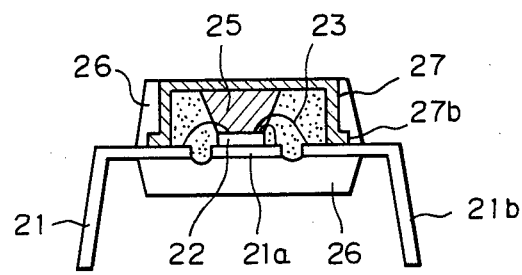
FIG. 5 is a cross-sectional view illustrating another embodiment of an EPROM device in accordance with the invention.

FIG. 5 illustrates another embodiment of the EPROM device according to the invention, wherein like reference numerals denote like parts as in the embodiment of FIG. 4. Accordingly, only parts different from FIG. 4 will be explained in detail hereinafter.

A hollow cap 27 shown in FIG. 5 is so constituted that the side walls 27a which contact the terminal portions 21b are L-shaped and include outer base flanges 27b extending away from the EPROM chip 22 and substantially parallel to and away from chip mounting portion 21a.

Since this structure lengthens the joint between the hollow cap 27 and the receptacle 26, which can act as an entry path for the introduction of harmful external atmosphere, especially moisture, such entry path to the EPROM chip 22 is lengthened, thereby preventing degradation of the EPROM chip 22 by moisture and also preventing separation of the cap 27 from the receptacle 26.

Since the EPROM device 20 of the invention is formed with the first insulating resin 28 enclosing the EPROM chip 22 not made of UV ray permeability resin, but rather of insulating resin, the cost of manufacture of the device of the invention is reduced in comparison with the prior EPROM device made of ceramic, because the resin itself is low-priced.

Additionally, since the sealing temperature at which the EPROM chip 22 is sealed is low, the thermal stress imparted to the EPROM chip 22 is reduced, which makes it possible to use thin metal wires 23 of the type preferable for use with high speed wire-bonding techniques.

In accordance with the prior ceramic package, a two-dimensional alloy would be formed by the reaction of the aluminum of the surface electrode of the EPROM chip with the thin metal wires due to the need for employing a high temperature sealing operation, and this would cause the resistance value of the wires to be high. To avoid this phenomenon, aluminum wires have been used as the thin metal wires in such prior devices.

However, since this invention achieves sealing with a synthetic resin, which does not require a high sealing temperature, the alloying reaction occurring in the prior art is suppressed, thereby making it possible to accomplish high speed wire-bonding by the use of gold wires.

According to the invention, since the chip mounting portion 21a of the well known lead frame 21, which is formed by etching or stamping of a metal plate, can be directly connected to the edge portions of the inner leads, the ground dies, which are necessary in the prior art, become unnecessary, thereby avoiding the difficult operation of installation thereof.

Additionally, since the EPROM device according to the invention is relatively lighter than that constituted by a ceramic package, the package density can be increased on printed circuit boards without cracks occurring in the package.

Accordingly, this invention provides a number of advantages.

FIG. 6(a) to FIG. 6(e) show the steps of manufacturing the EPROM device according to the present invention.

Figure 6:
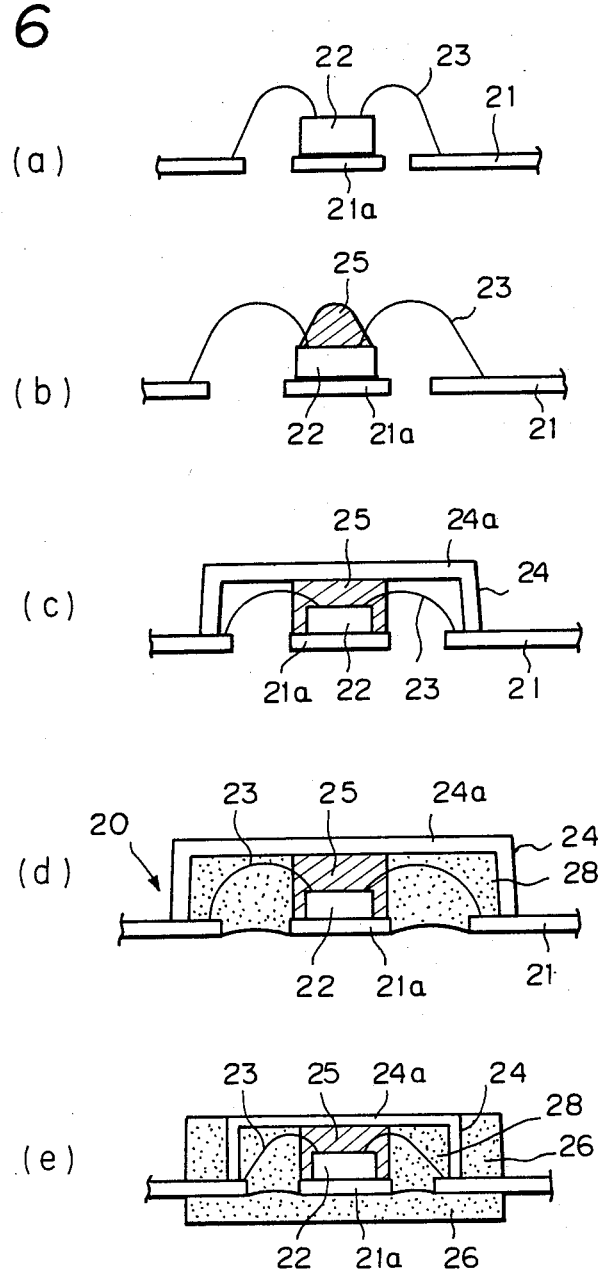
FIG. 6(a) to FIG. 6(e) are cross-sectional views illustrating the steps of manufacturing an EPROM device in accordance with the invention.

Firstly as shown in FIG. 6(a), the EPROM chip 22 is mounted on the chip mounting portion 21a of the lead frame 21 by die-bonding with Ag paste. Then, the electrodes formed on the surface of the EPROM 22 are wire-bonded with the thin metal wires 23 to the terminal portions 21b of the lead frame 21.

Secondly as shown in FIG. 6(b), the UV ray permeable resin 26 is dipped onto the surface of the EPROM chip 22. Then, as shown in FIG. 6(c), the hollow cap 24 made of, for example, alumina is applied over chip 22 and resin 25, whereby the UV ray permeable resin 25 is filled into the gap between the main surface of the EPROM chip 22 and the head portion 24a of the cap 24, and the cap 24 is fixed to the EPROM chip 22. The resin 25 is then hardened by heating.

Thirdly as shown in FIG. 6(d), the first insulating resin 28 is filled into the remainder of the interior space of cap 24 around the EPROM chip 22, the thin metal wires 23, resin 25 and the chip mounting portion 21a. Such filling is performed by potting with the EPROM device inverted with respect to the alignment shown in FIG. 6(d).

Then, after hardening the resin 28 by heating, sealing is performed by employing the second insulating resin to form the receptacle 26 as shown in FIG. 6(e).

By the above mentioned steps, the EPROM device 20 shown in FIG. 4 is completed.

What is claimed is:

1. An EPROM device comprising:
    a lead frame including a chip mounting portion and a plurality of terminal portions thereon, each said terminal portion including an inner portion and an outer portion;
    an EPROM chip mounted on said chip mounting portion, said EPROM chip having a main surface and being connected to said terminal portions by thin metal wires;
    a hollow cap mounted on said lead frame and covering said EPROM chip and said wires, said cap including a head portion made of a material which passes UV rays therethrough, said cap defining an interior space;
    a UV ray permeable resin filling at least a gap portion of said space between said head portion of said hollow cap and said main surface of said EPROM chip and thereby forming a UV ray transmissive path from said head portion to said main surface;
    a first insulating resin filling a remaining portion of said space around said UV ray permeable resin and thereby forming therewith a double filling resin structure completely filling said space; and
    a second insulating resin enclosing said cap except for said head portion thereof and enclosing said inner portions of said terminal portions of said lead frame.

2. An EPROM device as claimed in claim 1, wherein said hollow cap includes side walls extending from said head portion toward said lead frame, said side walls being L-shaped and including base flanges extending parallel to and away from said chip mounting portion of said lead frame.

3. An EPROM device as claimed in claim 1, wherein said thin metal wires are formed of gold.

* * * * *